United States Patent [19]
Kane et al.

[11] Patent Number: 5,410,158
[45] Date of Patent: Apr. 25, 1995

[54] BIPOLAR TRANSISTOR APPARATUS WITH ISO-TERMINALS

[75] Inventors: Robert C. Kane; James E. Jaskie, both of Scottsdale, Ariz.

[73] Assignee: Motorola, Inc., Schaumburg, Ill.

[21] Appl. No.: 7,229

[22] Filed: Jan. 22, 1993

[51] Int. Cl.[6] ............... H01L 27/12; H01L 45/00; H01L 49/02
[52] U.S. Cl. ................................. 257/10; 257/90; 257/577; 257/587
[58] Field of Search .......................... 257/10, 90

[56] References Cited

U.S. PATENT DOCUMENTS 2,960,659 11/1960 Burton ............................ 257/10
3,959,026 5/1976 Marine et al. ................... 257/90

OTHER PUBLICATIONS

Bazhehou et al. 'Synthetic Diamonds in Electronics", *Sov Phys Semicond*, Aug. 85, pp. 829-841.

*Primary Examiner*—Andrew J. James
*Assistant Examiner*—Stephen D. Meier
*Attorney, Agent, or Firm*—Eugene A. Parsons

[57] ABSTRACT

Apparatus including a diamond semiconductor material bipolar transistor having associated therewith a distally disposed iso-collector. The iso-collector, when operated with a suitable voltage, provides a communicating electric field to the bipolar transistor collector which, in concert with a voltage coupled to the transistor base places the apparatus in an ON mode to induce electrons to be emitted from the collector and to be subsequently collected at the iso-collector. An iso-base is optionally, distally disposed relative to the base of the bipolar transistor.

19 Claims, 4 Drawing Sheets

BIPOLAR TRANSISTOR APPARATUS WITH ISO-TERMINALS

FIELD OF THE INVENTION

This invention relates generally to bi-polar transistor devices and more particularly to an improved bi-polar transistor device employing diamond semiconductor material and distally disposed iso-terminals.

BACKGROUND OF THE INVENTION

Bi-polar transistor devices are known and commonly comprised of selectively impurity doped semiconductor regions within a semiconductor material substrate each of which regions are in communication with other of the transistor regions. As is also known, transistor operation is at least partially dependent on application of externally provided electric fields to portions of the regions which form semiconductor junctions within the transistor.

Known means for providing the electric fields include operably coupling appropriate voltage sources to conductive ohmic contacts disposed on selected regions such as, for some examples, an ohmic contact to the base region, an ohmic contact to the emitter region, and an ohmic contact to the collector region.

Some applications of transistors include signal amplifiers such as radio frequency (RF) and microwave frequency amplifiers. Transistors employed for such applications are susceptible to failure induced by high voltage reflected waves which may appear at the transistor terminals. As such it is frequently necessary to provide protection circuitry to reduce the possibility of damage to the transistor(s).

Further, known bipolar transistors have associated therewith a leakage current that is present in those instances when the transistor is operated in an OFF mode during which time no current is desired.

Accordingly, there exists a need for an improved transistor device which overcomes at least some of these shortcomings of the prior art.

SUMMARY OF THE INVENTION

This need and others are substantially met through provision of an improved bipolar transistor apparatus including a plurality of selectively impurity doped diamond material semiconductor regions, each of which regions is selectively disposed in fixed spaced relationship to each other region of the plurality of regions and wherein the regions define at least a collector, a base, and an emitter region such that at least an emitter-base junction and a collector-base junction are defined, and an iso-collector distally disposed with respect to the collector region.

This need and others are further met through provision of an improved bipolar transistor apparatus including a plurality of selectively impurity doped diamond material semiconductor regions, each of which regions is selectively disposed in fixed spaced relation to each other region of the plurality of regions and wherein the regions define at least a collector, a base, and an emitter region such that an emitter-base junction and a collector-base junction are defined, and an iso-collector distally disposed with respect to the collector region, and an iso-base distally disposed with respect to the base region.

It is one object of the present invention to provide an improved bipolar transistor apparatus which is substantially insensitive to reflected voltages which may be present in the circuitry in which the transistor apparatus is employed.

It is another object of the present invention to provide an improved bipolar transistor apparatus which substantially eliminates OFF mode current leakage from the transistor base region.

DETAILED DESCRIPTION OF THE DRAWINGS

Figure 1:
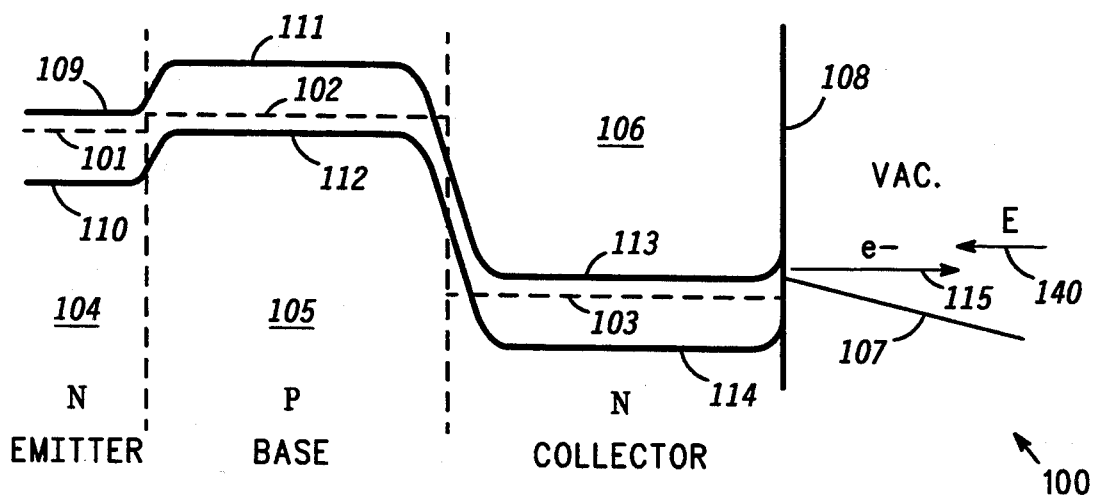
FIG. 1 is an illustration of an energy band diagram for a diamond semiconductor material bipolar transistor in accordance with the present invention.

Referring now to FIG. 1 there is depicted an energy band diagram 100 which represents the energy bands of a bipolar semiconductor transistor such as a diamond material semiconductor device and having associated therewith an externally provided electric field (E) 140. The energy band diagram 100 of FIG. 1 also depicts that the bipolar transistor is an NPN transistor which has been selectively impurity doped to provide an emitter region 104 which is N-doped, a base region 105 which is P-doped, and a collector region 106 which is N-doped. Emitter, base, and collector valance band energy levels 110, 112, 114 and emitter, base, and collector conduction band energy levels 109, 111, 113 are illustrated, as are emitter, base, and collector material Fermi levels 101, 102, 103.

It should be noted that the emitter-base junction realized at the interface between emitter region 104 and base region 105 is illustrated as a forward biased junction. It should also be noted that the collector-base junction realized at the interface between collector region 106 and base region 105 is illustrated as a reverse biased junction. The junctions biased as described provide for a bipolar transistor device which is in an ON mode of operation. In order to provide the energy level shifts as depicted in the energy band diagram of FIG. 1 it is necessary to couple potential differences on either side of each of the junctions. Alternatively an external electric field may induce the necessary potential across one or more of the junctions. FIG. 1 depicts that external electric field 140, communicates with collector region 106 to provide the potential necessary to reverse bias the collector-base junction and to also induce electron emission (e-) 115 from a collector region surface 108. Electric field 140, also serves to modify a potential barrier 107 which potential barrier 107 impedes the emission of electrons from collector region 106.

The energy band diagram of FIG. 1 is representative of that which may be obtained by employing selectively impurity doped diamond semiconductor material in concert with a communicating externally provided electric field.

Figure 2:
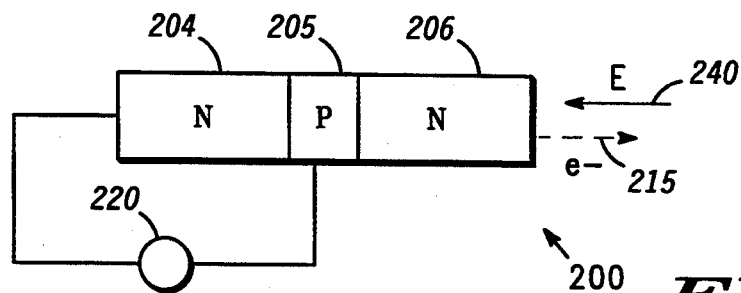
FIG. 2 is a schematic depiction of a diamond semiconductor material bipolar transistor in accordance with the present invention.

FIG. 2 is a further illustrative example which schematically depicts the structure described above with reference to FIG. 1 and wherein an NPN transistor having emitter, base, and collector regions 204, 205, 206, respectively, is provided. An externally provided potential, such as a voltage source 220, is operably coupled between emitter region 204 and base region 205 to provide a bias potential necessary to forward bias (ON mode) or reverse bias (OFF mode) the associated emitter-base junction. An externally provided electric field (E) 240, communicates with collector region 206 to provide a potential necessary to reverse bias the collector-base junction associated with collector region 206 and base region 205, such that the collector-base junction is reversed biased. Electric field 240 further serves to induce electrons to be emitted from collector region 206.

Figure 3:
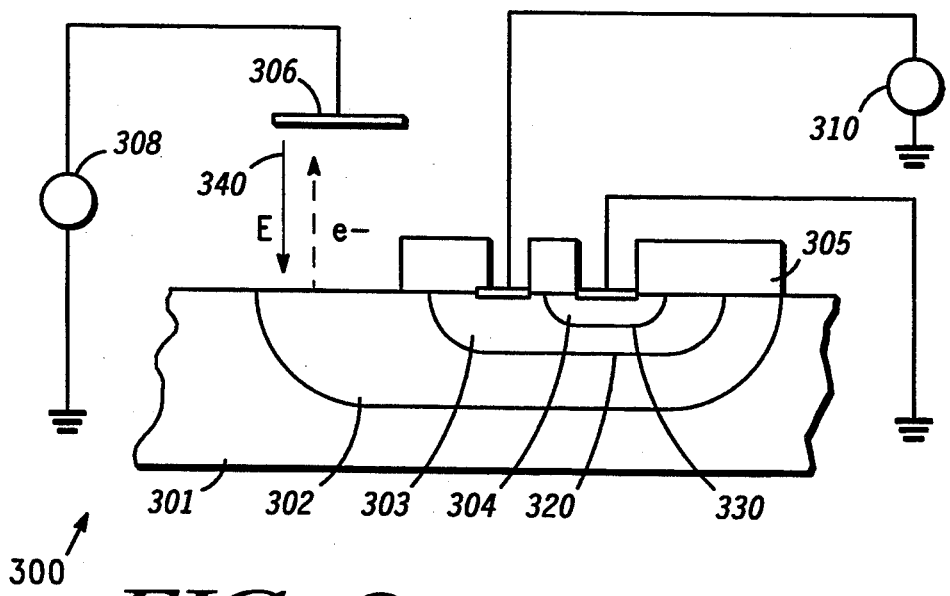
FIG. 3 illustrates an embodiment of a diamond semiconductor material bipolar transistor and iso-collector in accordance with the present invention.

FIG. 3 is a schematic representation of an embodiment of a diamond semiconductor material bipolar transistor iso-collector device 300 in accordance with the present invention. A semiconductor substrate 301 has disposed therein a bipolar transistor collector 302, for emitting electrons, base 303, and emitter 304. Emitter 304 is coupled to a reference potential (ground potential in this example). Base 303 is coupled to an externally provided source 310. Source 310 is also coupled to the reference potential. An iso-collector (isolated collector) 306, for collecting electrons, is distally disposed with respect to collector 302, such that upon application of a suitable voltage (via an externally provided voltage source 308) between iso-collector 306 and the reference potential an electric field 340 is communicated to collector 302 to reverse bias a collector-base junction 320.

Figure 4:
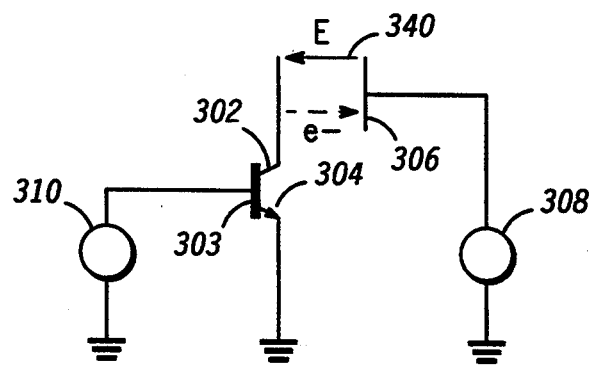
FIG. 4 is a schematic diagram of the diamond semiconductor material bipolar transistor illustrated in FIG. 3.

When source 310 provides a voltage to forward bias an emitter-base junction 330, transistor device 300 is placed in an ON mode and electric field 340 induces electrons to be emitted from collector 302. Emitted electrons are subsequently collected at iso-collector 306. A dielectric layer 305 comprised of material exhibiting a high relative permeability such as, for example, one of silicon or silicon dioxide provides for a reduction in the intensity of electric field 340 at emitter 303 and base 304. It is evident from the embodiment represented in FIG. 3 that no physical connection is effected to collector 302 in order to operate the device. FIG. 4 is a schematic diagram of diamond semiconductor material bipolar transistor 300 with iso-collector.

Figure 5:
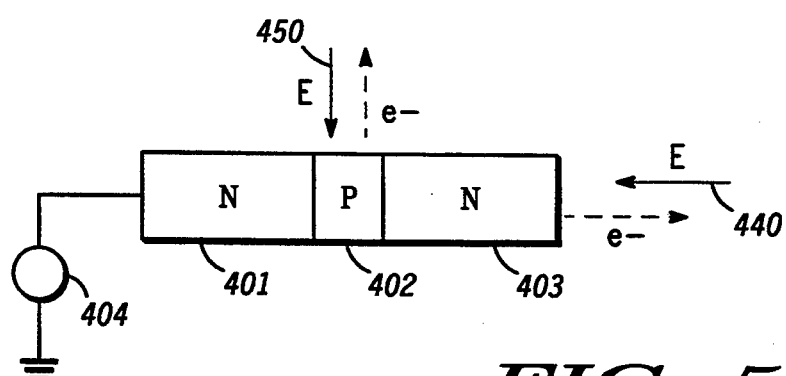
FIG. 5 is another schematic depiction of a diamond semiconductor material bipolar transistor in accordance with the present invention.

FIG. 5 is another schematic representation of a bipolar transistor 400, similar to that described previously with reference to FIG. 1, including an emitter 401, base 402, and collector 403. A potential source 404 is coupled between emitter 401 and a reference potential, herein depicted as ground potential. It should be understood that in some desired applications source 404 may not be required in which instances emitter 401 may be operably coupled to the reference potential. A first electric field 440 communicates with collector region 403 in a manner described previously with reference to FIGS. 2 and 3. A second electric field 450 communicates with base 402 to provide, in concert with source 404, either forward or reverse biasing of the associated emitter-base junction.

Figure 6:
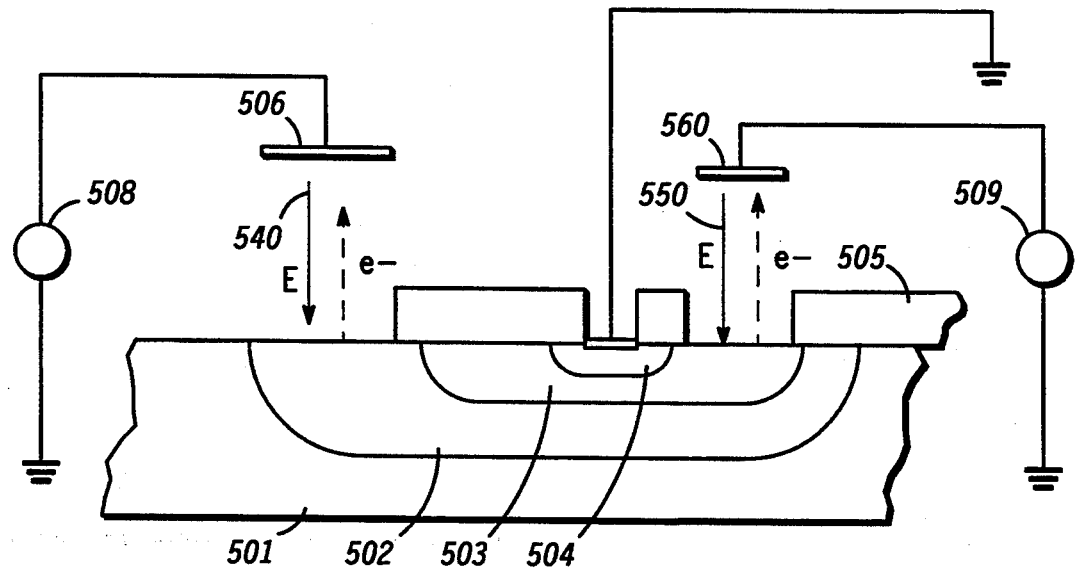
FIG. 6 illustrates another embodiment of a diamond semiconductor material bipolar transistor with iso-collector and iso-base in accordance with the present invention.

FIG. 6 is a schematic representation of an embodiment of a diamond semiconductor material, bipolar transistor iso-collector device 500 in accordance with the present invention. A semiconductor substrate 501 has disposed therein a bipolar transistor collector 502, base 503, and emitter 504. Emitter 504 is coupled to a reference potential (ground potential in this example). An iso-base 560 (isolated base) is coupled to a potential source 510 which is also coupled to the reference potential and in communication with base 503 via an electric field 550. An iso-collector 506 is distally disposed with respect to and in communication with collector 502 via an electric field 540.

Upon application of a suitable voltage (via a potential source 508) between iso-collector 506 and the reference potential, electric field 540 is communicated to collector 502 to reverse bias the collector-base junction. When a voltage (via a potential source 509) provides electric field 550 to forward bias the emitter-base junction, transistor device 500 is placed in an ON mode and electric field 550 induces electrons to be emitted from collector 502. Emitted electrons are subsequently collected at iso-collector 506. A dielectric layer 505 comprised of material exhibiting a high relative permeability, such as for example silicon or silicon dioxide, provides for a reduction in the intensity of electric fields 540 and 550 at desired regions of transistor device 500.

Figure 7:
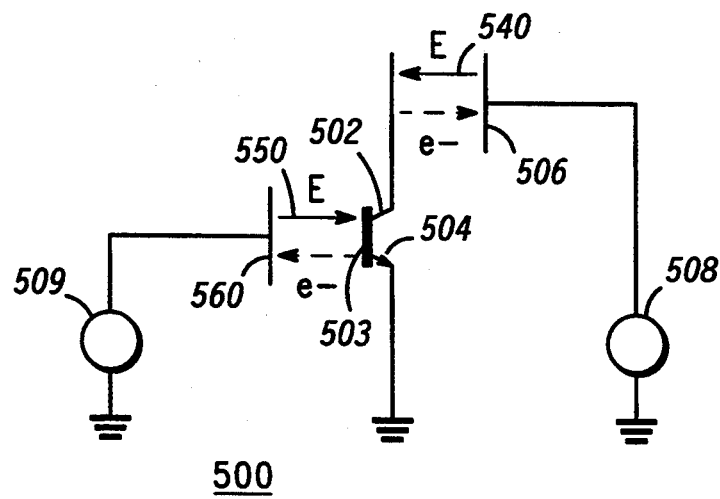
FIG. 7 is a schematic diagram of the diamond semiconductor material bipolar transistor with iso-collector and iso-base illustrated in FIG. 6.

Bipolar transistor 500 with iso-collector and iso-base, as depicted in FIG. 6, may be employed without the need to effect physical contact of electrodes to either collector 502 or base 503. As such it is evident the OFF mode current leakage is eliminated. FIG. 7 is a schematic diagram of diamond semiconductor material bipolar transistor 500 with iso-collector and iso-base.

Figure 8:
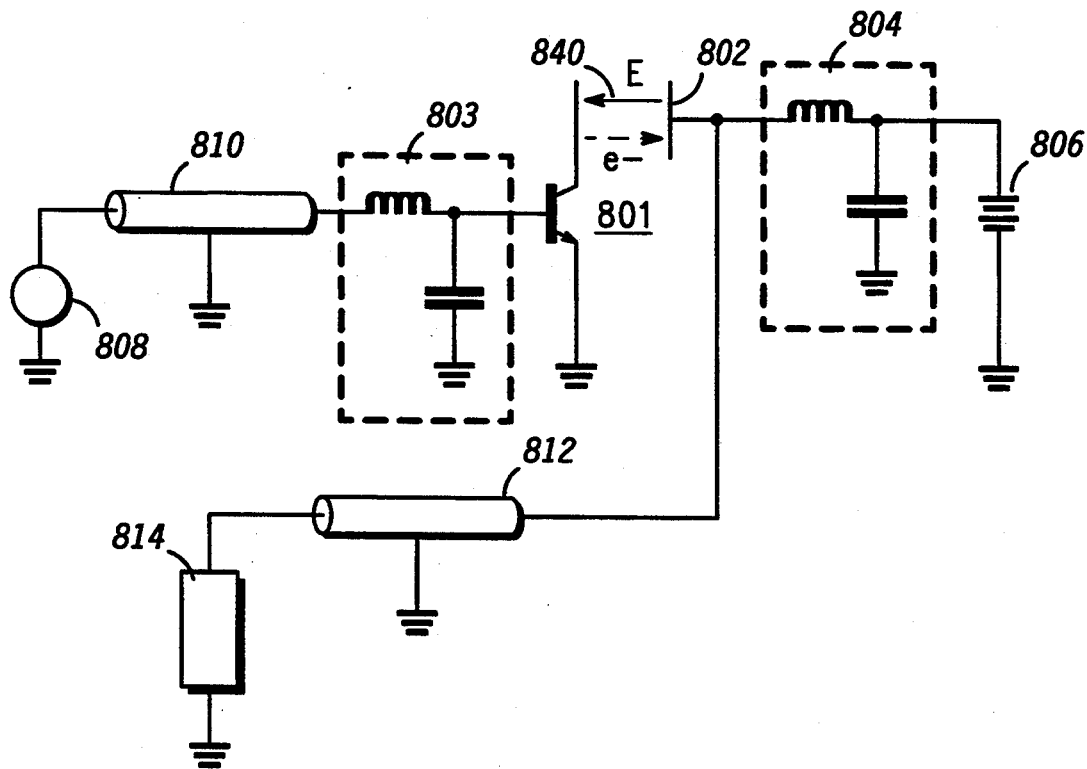
FIG. 8 is a schematic diagram of an electronic circuit application employing a diamond semiconductor material bipolar transistor with iso-collector in accordance with the present invention.

FIG. 8 is a schematic diagram of an electronic circuit application employing an embodiment of a diamond semiconductor material bipolar transistor with iso-collector. A diamond semiconductor material bipolar transistor 801 having associated therewith a distally disposed iso-collector 802 is depicted. As an example of one possible implementation of the embodiment depicted herein, iso-collector 802 is disposed in fixed spaced relationship with respect to the collector of bipolar transistor 801 at a distance on the order of from less than 1.0 $\mu$m to 1.0 mm. An illustrative impedance matching network 803, typically including passive circuit elements, such as resistors, capacitors, and inductors, is operably connected to bipolar transistor 801, reference potential (ground in this embodiment), and one end of an inner conductor of a transmission line 810. A signal source 808, such as a communication information source, is operably connected between a second end of the center conductor of transmission line 810 and ground.

A second illustrative impedance matching network 804, typically including at least some of inductors, resistors, and capacitors, is operably coupled between iso-collector 802, the reference potential, and a potential source 806, herein depicted as a voltage source. Iso-collector 802 is also connected to one end of a center conductor of a second transmission line 812. The second end of the center conductor of transmission line 812 is operably coupled to a load 814, which is representative of any termination that may be employed such as, for example: another active device stage (bipolar, field effect transistor, etc.); a radiating antenna element; a selectivity network, such as a filter network; and a dissipative network element, such as a resistive termination, etc.

A circuit application wherein load 814 is realized as, for example, an additional transistor stage or as an antenna may, as is commonly experienced, provide an impedance mismatch with respect to a characteristic impedance associated with transmission line 812. As such any signal which propagates along transmission line 812 could be partially or totally reflected back toward bipolar transistor 801.

In prior art embodiments it is possible that negative excursions of a reflected signal may combine with a forward propagating signal at the collector to drive the collector below (negative with respect to) a gate voltage level and forward bias the collector-base junction of the transistor to subsequently destroy the device.

In the diamond semiconductor material bipolar transistor with iso-collector any reflected signal, whether in concert with a forward propagating signal or not, is effectively physically isolated from the collector and even though forward biasing of the collector-base junction may be effected no electron flow results. This is evident in view of the unique attributes of the diamond semiconductor material of which the bipolar transistor is comprised. As depicted in FIG. 1, potential barrier 107 to electron emission from the diamond semiconductor material is effectively zero electron volts. However, the material of which the iso-collector, depicted in FIGS. 3, 6, and 8, is comprised does not exhibit such a low potential barrier to electron emission (commonly from 2.5 to 5 electron volts) and is inhibited from providing electrons to the collector even under the influence of an electric field (of reverse polarity to that depicted in the attendant diagrams) induced by a reflected signal of high magnitude. As such, the bipolar transistor device is effectively protected, that is isolated, from the effects of deleterious signals which may be present in the associated circuitry.

Figure 9:
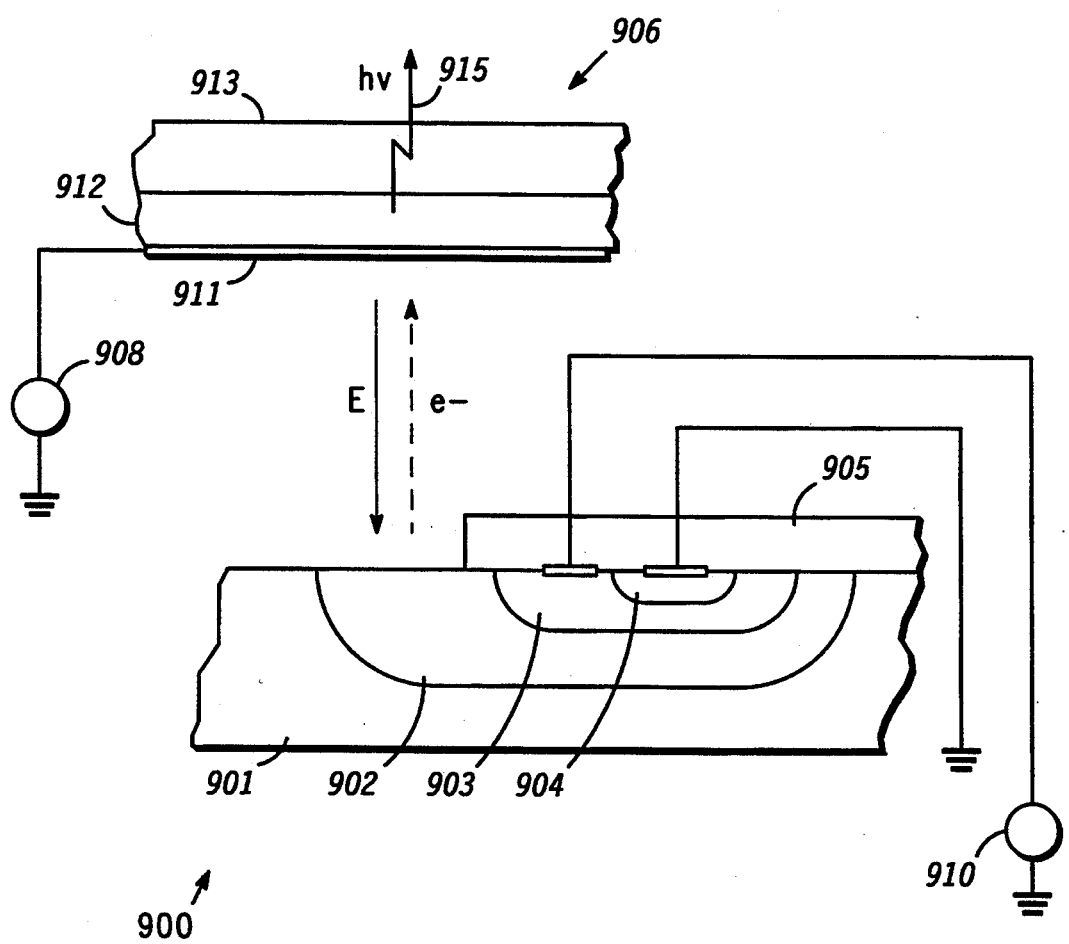
FIG. 9 is an illustrative depiction of an embodiment of a cathodoluminescent display apparatus in accordance with the present invention.

FIG. 9 is an illustrative depiction of an embodiment of a cathodoluminescent display apparatus employing a diamond semiconductor material bipolar transistor 900, as described previously with reference to FIG. 3 and wherein features similar to those first identified in FIG. 3 are herein similarly referenced beginning with the numeral "9". For the purposes of the apparatus of FIG. 9 an iso-collector 906 includes a substantially optically transparent faceplate 913 on which is disposed a cathodoluminescent layer 912 and a conductive layer 911. Electrons, emitted from collector region 902 of diamond semiconductor material bipolar transistor 900, impinge on distally disposed iso-collector 906 to excite photon emission 915 from cathodoluminescent layer 912. A plurality of diamond semiconductor material bipolar transistors 900 may be arrayed in a matrix such that selective operation of the array provides for excitation (photon emission) of discrete sections of iso-collector 906 corresponding to associated diamond semiconductor material bipolar transistors of the matrix array of transistors.

What is claimed is:

1. Bipolar transistor apparatus comprising:
   a bipolar transistor disposed in a semiconductor substrate and having a plurality of selectively impurity doped regions including an emitter designed to be coupled to a reference potential, a base and a collector;
   an iso-collector distally disposed with respect to and in electric field communication with the bipolar transistor collector;
   first means constructed to couple a suitable voltage between the base and the reference potential; and
   second means constructed to couple a suitable voltage between the iso-collector and the reference potential, such that upon application of suitable voltages to each of the first and second means the bipolar transistor apparatus is placed in an ON mode wherein a junction between the emitter and the base is forward biased, a junction between the collector and the base is reverse biased via an electric field communicating between the iso-collector and the collector of the bipolar transistor, and electron emission is initiated from the collector and collected at the iso-collector.

2. Bipolar transistor as claimed in claim 1 wherein the semiconductor substrate is comprised of diamond semiconductor material.

3. Bipolar transistor apparatus as claimed in claim 2 wherein the iso-collector is distally disposed on the order of 1.0 $\mu$m to 1.0 mm from the collector of the bipolar transistor.

4. Bipolar transistor apparatus as claimed in claim 1 and further including an iso-base distally disposed with respect to the base of the bipolar transistor and for providing a potential to forward bias a junction between the base and emitter so as to turn the bipolar transistor ON via a communicating electric field.

5. Bipolar transistor apparatus comprising:
   a bipolar transistor disposed in a semiconductor substrate and having a plurality of selectively impurity doped regions including an emitter constructed to be connected to a reference potential, a base and a collector;
   an iso-collector distally disposed with respect to and in electric field communication with the collector;
   an iso-base distally disposed with respect to and in electric field communication with the base;
   first means constructed to couple a suitable voltage between the iso-base and the reference potential; and
   second means constructed to couple a suitable voltage between the iso-collector and the reference potential, such that upon application of suitable voltages to each of the first and second means the bipolar transistor apparatus is placed in an ON mode wherein a junction between the emitter and the base is forward biased via a communicating electric field and a junction between the collector and the base is reverse biased via a communicating electric field, and electron emission is initiated from the collector and collected at the iso-collector.

6. Bipolar transistor apparatus as claimed in claim 5 wherein the semiconductor substrate is comprised of diamond semiconductor material.

7. Bipolar transistor apparatus as claimed in claim 5 wherein the iso-collector is distally disposed on the order of 1.0 $\mu$m to 1.0 mm from the collector.

8. Bipolar transistor apparatus comprising;

a plurality of selectively impurity doped diamond material semiconductor regions, each of which regions is selectively disposed in fixed spaced relationship to each other region of the plurality of regions and wherein the regions define a collector, a base, and an emitter region such that an emitter-base junction and a collector-base junction are defined; and an iso-collector distally disposed with respect to the collector region for electric field communication therebetween and for providing a potential to reverse bias the collector base junction and to induce electron emission to the iso-collector.

9. Bipolar transistor apparatus comprising:

a plurality of selectively impurity doped diamond material semiconductor regions, each of which regions is selectively disposed in fixed spaced relationship to each other region of the plurality of regions and wherein the regions define a collector, a base, and an emitter region such that an emitter-base junction and a collector-base junction are defined;

an iso-collector distally disposed with respect to the collector region for electric field communication therebetween and for providing a potential via the electric field communication to reverse bias the collector base junction and to induce electron emission to the iso-collector; and an iso-base distally disposed with respect to the base region for electric field communication therebetween and for providing a potential to forward bias a junction between the base and emitter so as to turn the bipolar transistor ON via the communicating electric field.

10. Cathodoluminescent display apparatus comprising:

a bipolar transistor disposed in a semiconductor material substrate and having a plurality of selectively impurity doped semiconductor material regions including an emitter, base and collector, for emitting electrons; and an iso-collector distally disposed with respect to the collector for collecting electrons emitted by the collector and for providing a potential via an electric field communication to reverse bias the collector base junction and to induce electron emission to the iso-collector, the iso-collector including a substantially optically transparent faceplate on which is disposed a cathodoluminescent layer and a conductive layer.

11. Cathodoluminescent display apparatus as claimed in claim 10 wherein the semiconductor material is comprised of diamond semiconductor material.

12. Cathodoluminescent display apparatus as claimed in claim 10 wherein the iso-collector is distally disposed on the order of 1.0 $\mu$m to 1.0 mm from the collector.

13. Cathodoluminescent display apparatus as claimed in claim 10 further including an iso-base distally disposed with respect to the base.

14. Cathodoluminescent display apparatus of claim 13 wherein the semiconductor material is comprised of diamond semiconductor material.

15. Cathodoluminescent display apparatus comprising:

a bipolar transistor disposed in a semiconductor substrate and having a plurality of selectively impurity doped regions including an emitter operably coupled to a reference potential, a base and a collector;

an iso-collector distally disposed with respect to and in electric field communication with the collector, the iso-collector including a substantially optically transparent faceplate on which is disposed a cathodoluminescent layer and a conductive layer;

first means constructed to couple a suitable voltage between the base and the reference potential; and second means constructed to couple a suitable voltage between the iso-collector and the reference potential, such that upon application of suitable voltages to each of the first and second means the cathodoluminescent display apparatus is placed in an ON mode wherein a junction between the emitter and the base is forward biased via a communicating electric field, a junction between the collector and the base is reverse biased via a communicating electric field and electron emission is initiated from the collector and collected at the iso-collector.

16. Cathodoluminescent display apparatus as claimed in claim 15 wherein the semiconductor substrate is comprised of diamond semiconductor material.

17. Cathodoluminescent display apparatus as claimed in claim 15 wherein the iso-collector is distally disposed on the order of 1.0 $\mu$m to 1.0 mm from the collector.

18. Cathodoluminescent display apparatus as claimed in claim 15 further including an iso-base distally disposed with respect to and in electric field communication with the base.

19. Cathodoluminescent display apparatus as claimed in claim 18 wherein the semiconductor substrate is comprised of diamond semiconductor material.

* * * * *